US007061269B1

(12) United States Patent
Agrawal et al.

(10) Patent No.: US 7,061,269 B1
(45) Date of Patent: Jun. 13, 2006

(54) I/O BUFFER ARCHITECTURE FOR PROGRAMMABLE DEVICES

(75) Inventors: Om Agrawal, Los Altos, CA (US); Giap Tran, San Jose, CA (US); Bai Nguyen, Union City, CA (US); Kiet Truong, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 69 days.

(21) Appl. No.: 10/843,708

(22) Filed: May 12, 2004

(51) Int. Cl.
*H01L 25/00* (2006.01)
*G06F 7/38* (2006.01)
*G06F 17/50* (2006.01)

(52) U.S. Cl. .............................. 326/41; 326/39; 716/16
(58) Field of Classification Search .................. 716/16; 326/41, 39
See application file for complete search history.

(56) References Cited

U.S. PATENT DOCUMENTS 6,472,904 B1 * 10/2002 Andrews et al. ............... 326/38
6,577,163 B1 * 6/2003 Waldrip et al. ............... 326/81

OTHER PUBLICATIONS

Xilinx: "Spartan-3 1.2V FPGA Family: Functional Description DS099-2 (v1.2)" Jul. 11, 2003.*
"Cyclone Architecture",, Altera Corporation, Oct. 2003, pp. 2-1, 2-39 thru 2-55.
"Spartan-3 1.2V FPGA Family: Functional Description", Xilinx, DS099-2 (v1.2), Jul. 11, 2003, Advance Product Specification, pp. 1-9.

* cited by examiner

*Primary Examiner*—Rexford Barnie
*Assistant Examiner*—Jason Crawford
(74) *Attorney, Agent, or Firm*—Steve Mendelsohn

(57) ABSTRACT

Programmable devices, such as FPGAs, are designed with I/O buffer architectures having (at least) three different types of I/O buffers: single-ended buffers with Peripheral Component Interconnect (PCI) clamps, single-ended buffers without PCI clamps, and differential buffers without PCI clamps. By distributing these different types of I/O buffers around the periphery of the device, a relatively low-cost device can be implemented with relatively small I/O buffers that collectively provide all of the I/O signaling functionality of prior-art devices that are implemented with relatively large, all-purpose I/O buffers, each of which supports the full range of I/O signaling options available on the device.

19 Claims, 4 Drawing Sheets

I/O BUFFER ARCHITECTURE FOR PROGRAMMABLE DEVICES

TECHNICAL FIELD

The present invention relates to programmable devices, such as field-programmable gate arrays (FPGAs), and, in particular, to the input/output (I/O) buffer architecture of such devices.

BACKGROUND

Because they are programmable, FPGAs can be configured (i.e., programmed) to support different signal and data processing applications. In order to expand the number of different types of applications that an FPGA can support, conventional FPGAs are typically designed with an I/O buffer architecture that supports different signaling protocols, including both single-ended and differential signaling protocols.

One way to provide an FPGA that supports a variety of different signaling protocols is to implement the FPGA with programmable I/O buffers, where each programmable I/O buffer supports any and all of the desired signaling protocols. While such an approach provides an FPGA with a high level of functional flexibility, it does so at the cost of having to implement individual, all-purpose I/O buffers that are relatively large (in layout area).

Some prior-art FPGAs have single-ended I/O buffers with PCI (Peripheral Component Interconnect) clamps and single-ended I/O buffers without PCI clamps. While these FPGAs may support 3.3V signaling on all four sides of the devices and adequate PCI support, they do not provide LVDS (Low-Voltage Differential Signaling) support.

Other prior-art FPGAs have single-ended and differential buffers with PCI clamps. While these FPGAs may provide adequate PCI and LVDS support, they do not support 3.3V Series Stub Terminated Logic (SSTL3) signaling on all four sides of the devices.

SUMMARY

Problems in the prior art are addressed in accordance with the principles of the present invention by designing FPGAs and other programmable devices with an I/O architecture having at least three different types of I/O buffers: single-ended buffers with PCI clamps, single-ended buffers without PCI clamps, and differential buffers without PCI clamps. These three different types of I/O buffer are distributed around the periphery of the device to provide support for different types of signaling at different locations on the device. For example, in one preferred embodiment, single-ended buffers without PCI clamps and differential buffers without PCI clamps are both located on both the left and right sides of the device, while the top and bottom sides have only single-ended buffers with PCI clamps.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
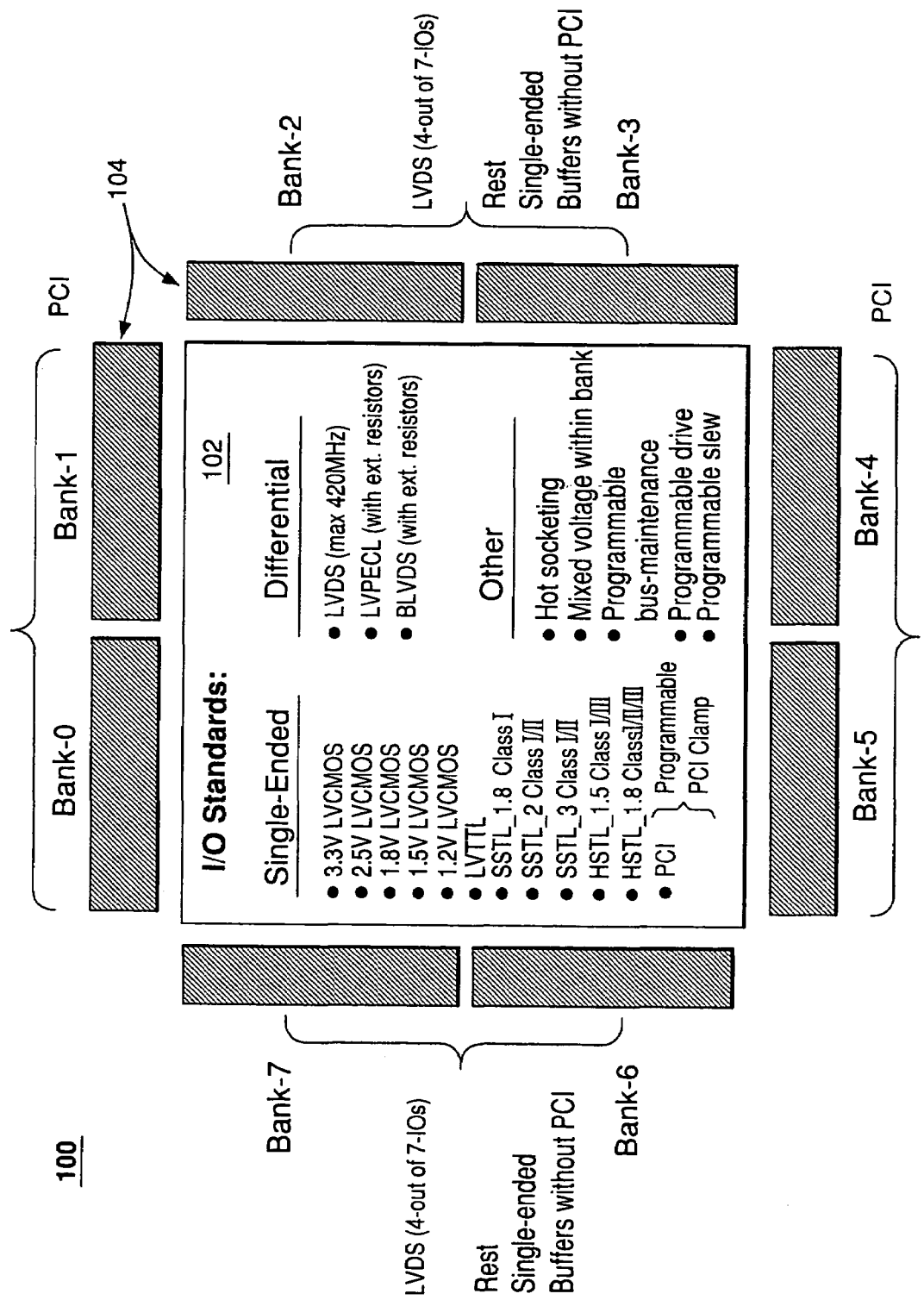
FIG. 1 shows a high-level block diagram of an FPGA, according to one embodiment of the present invention.

FIG. 1 shows a high-level block diagram of an FPGA 100, according to one embodiment of the present invention. As shown in FIG. 1, FPGA 100 has a programmable logic core 102 surrounded by an I/O architecture 104 consisting of eight banks (labeled Bank-0 to Bank-7) of programmable I/O buffers. According to this particular embodiment, each of Bank-0 and Bank-1 at the top side of the device and Bank-4 and Bank-5 at the bottom side of the device contains single-ended buffers with PCI clamps, while each of Bank-2 and Bank-3 at the right side of the device and Bank-6 and Bank-7 at the left side of the device contains both single-ended buffers without PCI clamps and differential buffers without PCI clamps. For example, in one possible implementation, four out of every seven I/O buffers in Banks-2, -3, -6, and -7 are differential buffers without PCI clamps, while the rest of the I/O buffers in those banks are single-ended buffers without PCI clamps.

With all three of these different types of I/O buffers, FPGA 100 is capable of supporting all of the following types of I/O signaling:

Single-Ended I/O Standards:
  3.3V Low-Voltage Complementary Metal-Oxide Semiconductor (LVCMOS)
  2.5V LVCMOS
  1.8V LVCMOS
  1.5V LVCMOS
  1.2V LVCMOS
  Low-Voltage Transistor Transistor Logic (LVTTL)
  SSTL_1.8 Class I, where SSTL stands for Series Stub Terminated Logic
  SSTL_2 Class I/II
  SSTL_3 Class I/II
  HSTL_1.5 Class I/III, where HSTL stands for High-Speed Transceiver Logic
  HSTL_1.8 Class I/II/III
  PCI
Differential I/O Standards
  Low-Voltage Differential Signaling (LVDS) (max 420 MHz)
  Low-Voltage Positive Emitter Coupled Logic (LVPECL) (with external resistors)
  Bidirectional LVDS (B-LVDS) (with external resistors)
Other I/O Signaling Characteristics
  Hot socketing
  Mixed voltage within bank
  Programmable bus maintenance
  Programmable drive
  Programmable slew Other embodiments of the present invention might be implemented to support only subsets of these different types and characteristics of I/O signaling and/or other I/O standards and/or signaling having other I/O signaling characteristics.

Figure 2:
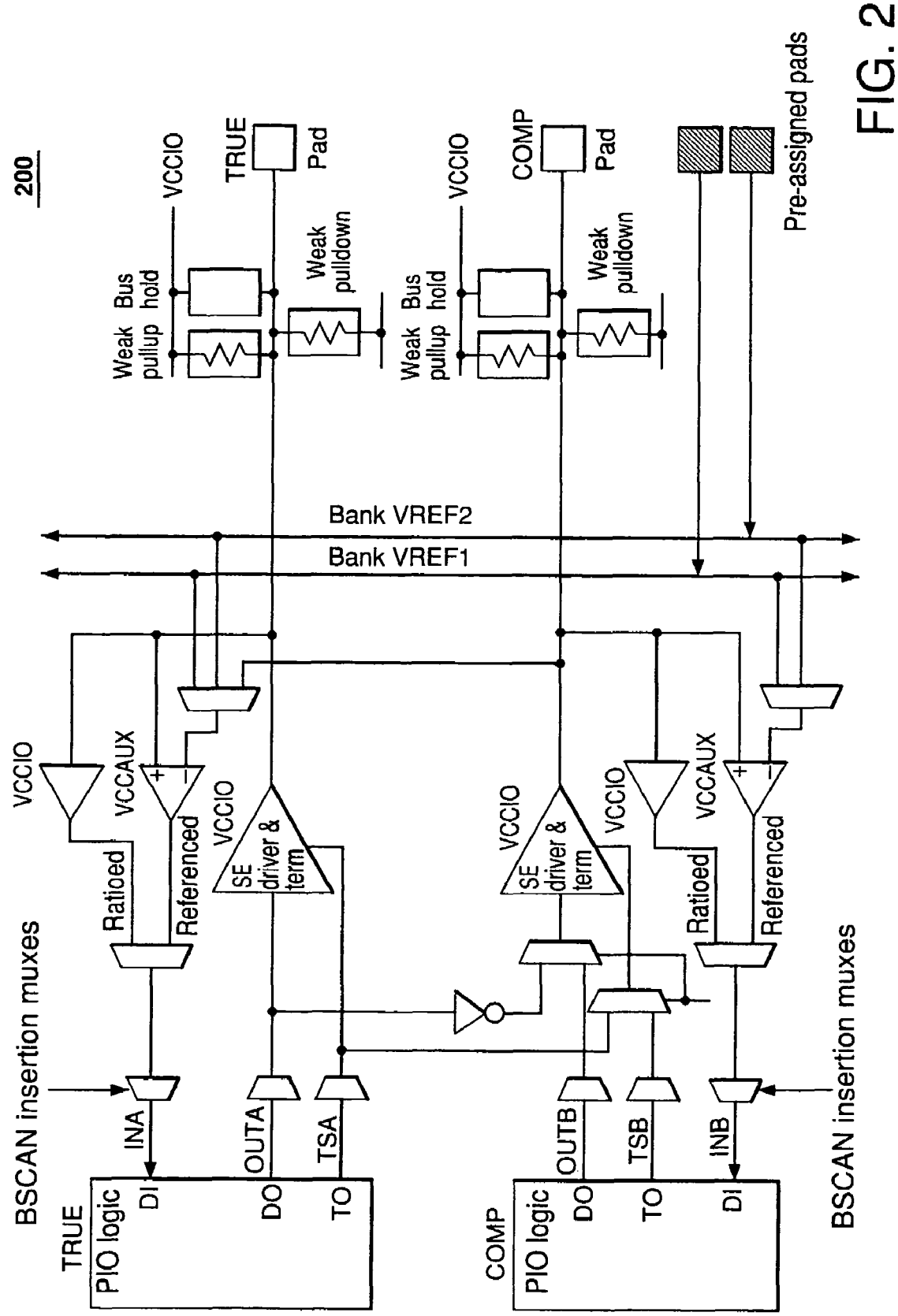
FIGS. 2–4 show schematic diagrams of the three types of I/O buffers implemented within the I/O architecture of the FPGA of FIG. 1.
Figure 3:
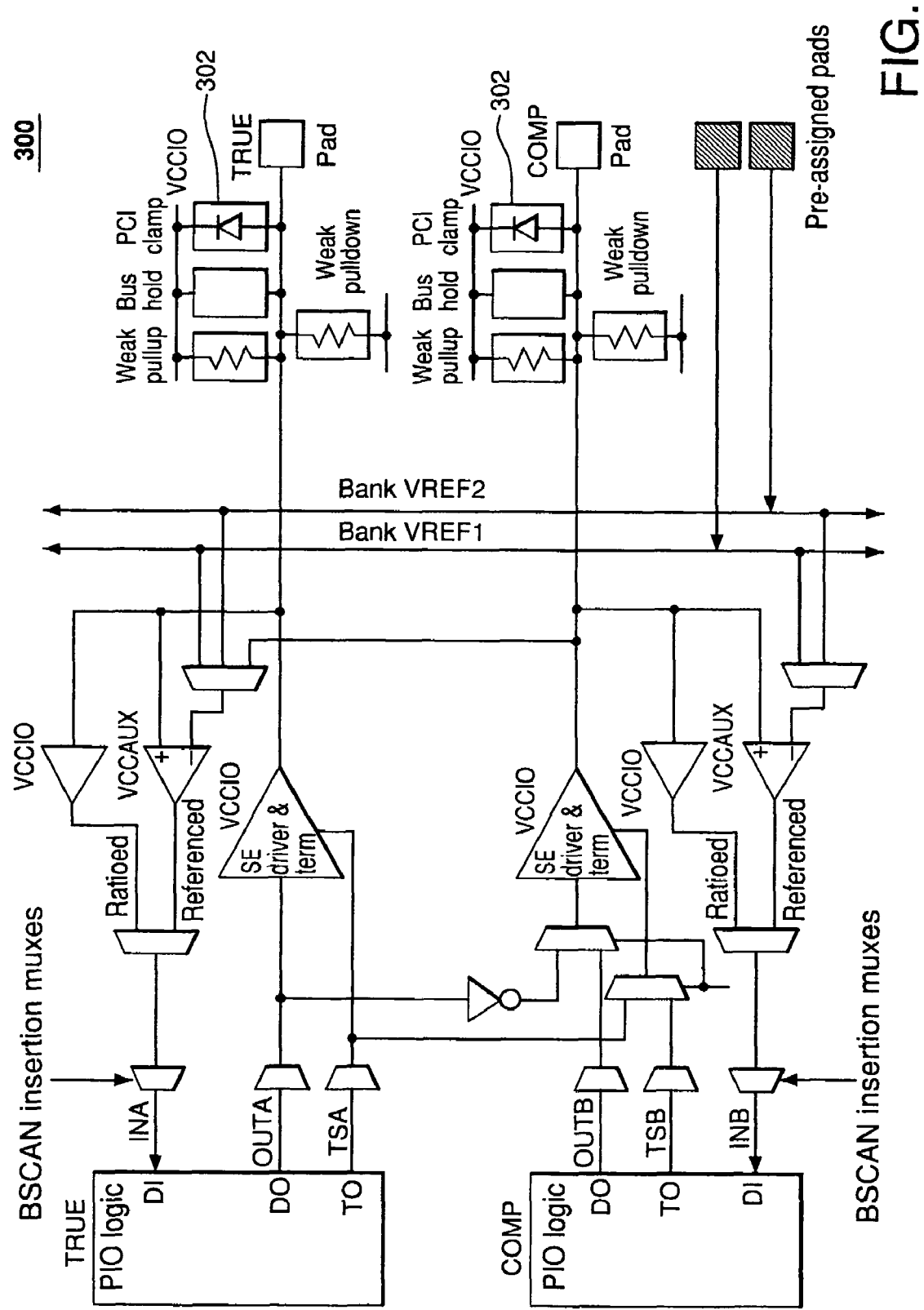
Figure 4:
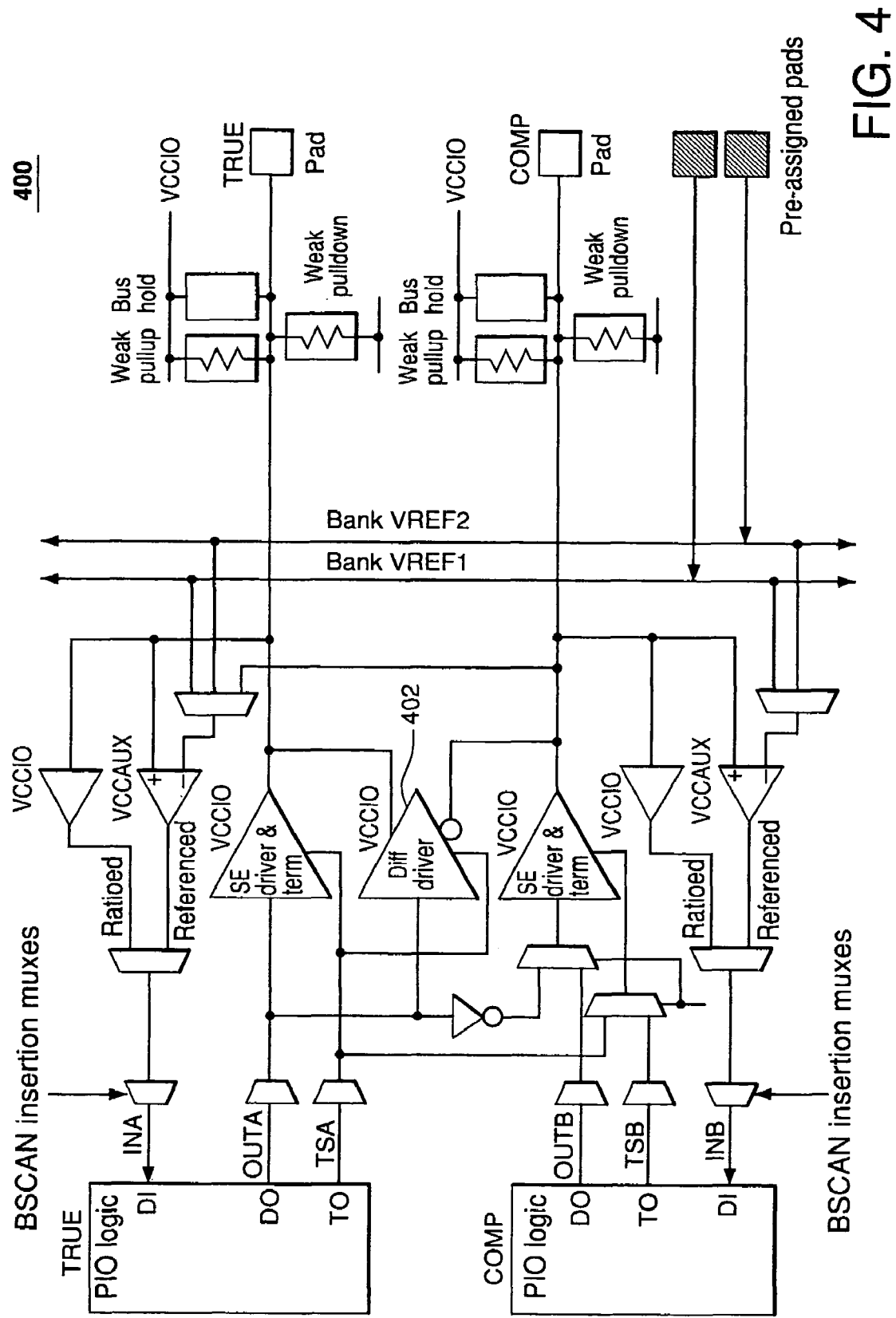

FIGS. 2–4 show schematic diagrams of the three types of I/O buffers implemented within I/O architecture 104 of FPGA 100 of FIG. 1. In particular, FIG. 2 shows a single-ended buffer 200 without PCI clamps, FIG. 3 shows a single-ended buffer 300 with PCI clamps 302, and FIG. 4 shows a differential buffer 400 without PCI clamps. Instances of both single-ended buffer 200 and differential buffer 400 are implemented on both the right and left sides of FPGA 100, while instances of single-ended buffer 300 are implemented on both the top and bottom sides of FPGA 100.

As mentioned previously, in the embodiment of FIG. 1, four out of every seven I/O buffers on the left and right sides of FPGA 100 are differential buffers without PCI clamps, while the rest of the I/O buffers on those sides are single-ended buffers without PCI clamps. In particular, the I/O buffers on the left and right sides of FPGA 100 are arranged in groups of 14 I/O buffers, where each group has the following configuration:

D1 D2 S3 S4 D5 D6 S7 S8 D9 D10 S11 S12 D13 D14, where each Di represents a differential buffer and each Si represents a single-ended buffer. In this group configuration, eight of the 14 I/O buffers (i.e., four out of every seven) are differential buffers, with each pair of differential buffers separated by a pair of single-ended buffers. This group configuration is repeated a number of times on each of the left and right sides of FPGA 100.

Although there are particular differences, these three types of I/O buffers share a similar basic architecture. Those skilled in the art will understand how to implement and operate the muxes, drivers, and other components shown in the schematic diagrams to achieve these three different types of I/O buffers. Note that differential buffer 400 can be configured to support single-ended signaling by operatively disabling differential driver 402.

Table I identifies the different signaling characteristics supported on the different sides of FPGA 100.

The present invention has been implemented in the context of FPGAs having an I/O buffer architecture consisting of three types of I/O buffers distributed within eight banks of I/O buffers, two banks on each side of the device. The invention is not necessarily so limited. For example, in addition to the three types of I/O buffers described, an FPGA of the present invention could also include additional types of I/O buffers, such as one or more differential buffers with PCI clamps. Moreover, the different types of I/O buffers could be distributed differently and/or within different numbers of I/O banks.

Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

It will be further understood that various changes in the details, materials, and arrangements of the parts which have been described and illustrated in order to explain the nature of this invention may be made by those skilled in the art without departing from the scope of the invention as expressed in the following claims.

TABLE I

| | SIGNALING CHARACTERISTICS | |
|---|---|---|
| | Top and Bottom Sides | Right and Left Sides |
| Types of I/O Buffers | Single-ended | Single-ended and Differential |
| Output Standards Supported | LVTTL | LVTTL |
| | LVCMOS33 | LVCMOS33 |
| | LVCMOS25 | LVCMOS25 |
| | LVCMOS18 | LVCMOS18 |
| | LVCMOS15 | LVCMOS15 |
| | LVCMOS12 | LVCMOS12 |
| | SSTL18_I | SSTL18_I |
| | SSTL2_I,II | SSTL2_I,II |
| | SSTL3_I,II | SSTL3_I,II |
| | HSTL15_I,III | HSTL15_I,III |
| | HSTL18_I,II,III | HSTL18_I,II,III |
| Inputs | Single-ended, Differential | Single-ended, Differential |
| Clock Inputs | Single-ended, Differential | Single-ended, Differential |
| PCI Support | PCI33 | |
| LVDS/LVPECL/B-LVDS Emulation with external resistors | LVDS, LVPECL, and B-LVDS emulation via LVCMOS buffers using external resistors | LVDS, LVPECL, and B-LVDS emulation via LVCMOS buffers using external resistors |
| LVDS Output Buffers | | LVDS (3.5 mA) Buffers |

Although not every one of the listed I/O standards is supported at every I/O buffer, or for that matter on every side of the device, I/O architecture 104 as a whole is designed to support all of these different I/O standards and signaling characteristics. In particular, I/O architecture 104 provides PCI support (on the top and bottom sides), LVDS support (on the right and left sides), and 3.3V support (on all four sides). Moreover, because each type of I/O buffer is designed to support only a subset of the different I/O standards, the size of each individual I/O buffer is much smaller than the sizes of prior-art, all-purpose I/O buffers, each of which was designed to support all of the FPGA's different I/O standards. In this way, FPGA 100 provides a good balance between high functionality and low cost.

We claim:

1. A programmable device having programmable input/output (I/O) circuitry and programmable logic connected to receive incoming signals from and provide outgoing signals to the I/O circuitry, the programmable I/O circuitry comprising:

one or more single-ended I/O buffers with PCI clamps;

one or more single-ended I/O buffers without PCI clamps; and one or more differential I/O buffers without PCI clamps, wherein each I/O buffer is adapted to be programmably coupled to the programmable logic, wherein:

the single-ended I/O buffers with PCI camps are located only on first and third sides of the device;

the single-ended I/O buffers without PCI clamps are located only on second and fourth sides of the device; and the differential I/O buffers without PCI clamps are located only on the second and fourth sides of the device.

2. The invention of claim 1, wherein, for every seven I/O buffers on the second and fourth sides of the device:
four of the seven I/O buffers are differential I/O buffers without PCI clamps; and
three of the seven I/O buffers are single-ended I/O buffers without PCI clamps.

3. The invention of claim 1, wherein:
the first and third sides are the top and bottom sides of the device; and
the second and fourth sides are the right and left sides of the device.

4. The invention of claim 1, wherein each differential I/O buffer without PCI clamps can be programmably configured to support single-ended signaling.

5. The invention of claim 1, wherein each differential I/O buffer supports signaling conforming to at least one LVDS standard.

6. The invention of claim 1, wherein each single-ended I/O buffer with PCI clamps supports signaling conforming to at least one PCI standard.

7. The invention of claim 6, wherein each single-ended I/O buffer with PCI clamps supports signaling conforming to PCI33 standard.

8. The invention of claim 1, wherein each I/O buffer supports signaling conforming to at least one LVTTL standard, at least one LVCMOS standard, at least one SSTL standard, and at least one HSTL standard.

9. The invention of claim 8, wherein each I/O buffer supports signaling conforming to LVTTL, LVCMOS33, LVCMOS25, LVCMOS18, LVCMOS15, LVCMOS12, SSTL18_I, SSTL2_I, SSTL2_II, SSTL3_I, SSTL3_II, HSTL15_I, HSTL15_III, HSTL18_I, HSTL18_II, and HSTL18_III standards.

10. The invention of claim 1, wherein:
each differential I/O buffer can be configured to support single-ended signaling;
each differential I/O buffer supports signaling conforming to at least one LVDS standard;
each single-ended I/O buffer with PCI clamps supports signaling conforming to at least one PCI standard; and
each I/O buffer supports signaling conforming to at least one LVTTL standard, at least one LVCMOS standard, at least one SSTL standard, and at least one HSTL standard.

11. The invention of claim 10, wherein:
for every seven I/O buffers on the second and fourth sides of the device:
four of the seven I/O buffers are differential I/O buffers without PCI clamps; and
three of the seven I/O buffers are single-ended I/O buffers without PCI clamps the first and third sides are the top and bottom sides of the device;
the second and fourth sides are the right and left sides of the device;
each single-ended I/O buffer with PCI clamps supports signaling conforming to PCI33 standard; and
each I/O buffer supports signaling conforming to LVTTL, LVCMOS33, LVCMOS25, LVCMOS18, LVCMOS15, LVCMOS12, SSTL18_I, SSTL2_I, SSTL2_II, SSTL3_I, SSTL3_II, HSTL15_I, HSTL15_III, HSTL18_I, HSTL18_II, and HSTL18_µIII standards.

12. A programmable device having programmable input/output (I/O) circuitry and programmable logic connected to receive incoming signals from and provide outgoing signals to the I/O circuitry, the programmable I/O circuitry comprising:
one or more single-ended I/O buffers with PCI clamps located only on first and third sides of the device; and
one or more single-ended I/O buffers without PCI clamps located only on second and fourth sides of the device,
wherein each I/O buffer is adapted to be programmably coupled to the programmable logic.

13. A programmable device having programmable input/output (I/O) circuitry and programmable logic connected to receive incoming signals from and provide outgoing signals to the I/O circuitry, the programmable I/O circuitry comprising:
one or more single-ended I/O buffers with PCI clamps located only on first and third sides of the device; and
one or more differential I/O buffers without PCI clamps located only on second and fourth sides of the device,
wherein each I/O buffer is adapted to be programmably coupled to the programmable logic.

14. The invention of claim 12, wherein each single-ended I/O buffer with PCI clamps supports signaling conforming to at least one PCI standard.

15. The invention of claim 12, wherein each I/O buffer supports signaling conforming to at least one LVTTL standard, at least one LVCMOS standard, at least one SSTL standard, and at least one HSTL standard.

16. The invention of claim 13, wherein each differential I/O buffer without PCI clamps can be programmably configured to support single-ended signaling.

17. The invention of claim 13, wherein each differential I/O buffer supports signaling conforming to at least one LVDS standard.

18. The invention of claim 13, wherein each single-ended I/O buffer with PCI clamps supports signaling conforming to at least one PCI standard.

19. The invention of claim 13, wherein each I/O buffer supports signaling conforming to at least one LVTTL standard, at least one LVCMOS standard, at least one SSTL standard, and at least one HSTL standard.

* * * * *